(12) United States Patent
McLaughlin et al.

(10) Patent No.: US 10,098,259 B2
(45) Date of Patent: Oct. 9, 2018

(54) HEAT DISSIPATION IN ELECTRONICS

(71) Applicant: Microsoft Technology Licensing, LLC, Redmond, WA (US)

(72) Inventors: Robyn Rebecca Reed McLaughlin, Seattle, WA (US); Jeffrey Taylor Stellman, San Francisco, CA (US); Andrew Hill, Redmond, WA (US); Paul Bornemann, North Bend, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 213 days.

(21) Appl. No.: 14/827,068

(22) Filed: Aug. 14, 2015

(65) Prior Publication Data
US 2017/0049006 A1 Feb. 16, 2017

(51) Int. Cl.
*F28F 7/00* (2006.01)
*H05K 7/20* (2006.01)
(Continued)

(52) U.S. Cl.
CPC ..... *H05K 7/20336* (2013.01); *F28D 15/0233* (2013.01); *F28D 15/0275* (2013.01);
(Continued)

(58) Field of Classification Search
CPC . H01L 23/467; H01L 23/427; H01L 23/3672; F28D 15/02; F28D 15/0233;
(Continued)

(56) References Cited

U.S. PATENT DOCUMENTS 3,261,396 A * 7/1966 Trunk ................. H01L 23/4006
165/185
3,573,567 A * 4/1971 Harris .................. H01L 23/051
174/16.3
(Continued)

FOREIGN PATENT DOCUMENTS

CN 1805133 A * 7/2006 ......... F28D 15/0233
GB 2337162 A 11/1999
(Continued)

OTHER PUBLICATIONS

Yang, CN 1,805,133; dated Jul. 19, 2006, machine translation.*
(Continued)

*Primary Examiner* — Hung Q Nguyen
*Assistant Examiner* — Mark L Greene
(74) *Attorney, Agent, or Firm* — Lempia Summerfield Katz LLC (57) ABSTRACT

Heat dissipation configurations and methods are described herein. A heat dissipation apparatus may include an individual piece of metal having a thermally conductive metal surface. The metal surface includes a plurality of ridges or protrusions extending from a base of the metal surface, wherein an air flow channel is provided between each two adjacent protrusions, therein providing a plurality of air flow channels. The apparatus is configured to dissipate heat for an electronic device having an active cooling source directing air through the plurality of air flow channels. In some examples, the heat dissipation apparatus is a vapor chamber, and the surface includes a section having a trough and a raised area or platform surrounded by the trough, wherein the raised area is configured to contact a microprocessor die in communication with the vapor chamber.

10 Claims, 6 Drawing Sheets

(51) Int. Cl.
*H01L 23/367* (2006.01)
*F28D 15/02* (2006.01)
*F28F 3/04* (2006.01)
*H01L 23/427* (2006.01)
*H01L 23/467* (2006.01)
*B23P 15/26* (2006.01)
*F28D 21/00* (2006.01)
*H01L 21/48* (2006.01)
*H01L 25/065* (2006.01)

(52) U.S. Cl.
CPC .............. *F28F 3/044* (2013.01); *F28F 3/046* (2013.01); *H01L 23/3672* (2013.01); *H01L 23/427* (2013.01); *H01L 23/467* (2013.01); *B23P 15/26* (2013.01); *F28D 2021/0028* (2013.01); *F28D 2021/0029* (2013.01); *H01L 21/4882* (2013.01); *H01L 23/3677* (2013.01); *H01L 25/0655* (2013.01)

(58) Field of Classification Search
CPC ..... F28D 2021/0028; F28D 2021/0029; F28D 15/0275; H05K 7/20336
See application file for complete search history.

(56) References Cited

U.S. PATENT DOCUMENTS

| | | | |
|---|---|---|---|
| 5,409,055 | A | 4/1995 | Tanaka et al. |
| 5,778,970 | A * | 7/1998 | Chang ................... H01L 23/367 165/185 |
| 5,991,153 | A | 11/1999 | Heady et al. |
| 6,082,443 | A | 7/2000 | Yamamoto et al. |
| 6,244,331 | B1 * | 6/2001 | Budelman ............... F28F 3/022 165/121 |
| 6,269,866 | B1 * | 8/2001 | Yamamoto .......... F28D 15/0233 165/104.26 |
| 6,550,531 | B1 | 4/2003 | Searls et al. |
| 6,661,660 | B2 | 12/2003 | Prasher et al. |
| 6,853,068 | B1 | 2/2005 | Djekic |
| 7,336,486 | B2 | 2/2008 | Mongia |
| 7,380,585 | B2 * | 6/2008 | Liu ..................... F28D 15/0266 165/104.33 |
| 7,447,029 | B2 | 11/2008 | Lai et al. |
| 7,462,934 | B2 | 12/2008 | Reents |
| 7,599,185 | B2 | 10/2009 | Meyer, IV et al. |
| 7,732,918 | B2 | 6/2010 | Dangelo et al. |
| 8,331,094 | B2 * | 12/2012 | Ankireddi ............ H01L 23/367 165/185 |
| 8,462,508 | B2 | 6/2013 | Lankston, II et al. |
| 2002/0080583 | A1 | 6/2002 | Prasher et al. |
| 2004/0112571 | A1 * | 6/2004 | Kenny .................... F04B 17/00 165/80.3 |
| 2005/0045308 | A1 | 3/2005 | Wang et al. |
| 2006/0113065 | A1 | 6/2006 | Wolford et al. |
| 2006/0203450 | A1 | 9/2006 | Wei |
| 2007/0006992 | A1 * | 1/2007 | Liu ..................... F28D 15/0266 165/104.26 |
| 2007/0261242 | A1 | 11/2007 | Xia et al. |
| 2008/0062651 | A1 | 3/2008 | Reis et al. |
| 2008/0283222 | A1 | 11/2008 | Chang et al. |
| 2011/0232877 | A1 | 9/2011 | Meyer et al. |
| 2014/0182132 | A1 | 7/2014 | Chen |
| 2014/0182820 | A1 | 7/2014 | Chen |
| 2014/0240918 | A1 | 8/2014 | Damaraju et al. |

FOREIGN PATENT DOCUMENTS

| | | |
|---|---|---|
| JP | 10267571 A | 10/1998 |
| JP | 10288481 A | 10/1998 |

OTHER PUBLICATIONS

"International Search Report and Written Opinion Issued in PCT Application No. PCT/US2016/042702", dated Mar. 24, 2017, 18 Pages.

Guoping Xu et al., "Extension of Air Cooling for High Power Processors", In Proceedings of Ninth Intersociety Conference on Thermal and Thermomechanical Phenomena in Electronic Systems, Jun. 1, 2004, pp. 186-193.

Shou-Shing Hsieh et al., "Analytical Solution of Thermal Resistance of Vapor Chamber Heat Sink with and without Pillar", In Proceedings of Energy Conversion and Management, Oct. 2007, pp. 2708-2717, vol. 48.

Thang Nguyen et al., "Use of Heat Pipe/Heat Sink for Thermal Management of High Performance CPU's", In Proceedings of Sixteenth Annual IEEE Semiconductor Thermal Measurement and Management Symposium, Mar. 20, 2003, pp. 76-79.

* cited by examiner

HEAT DISSIPATION IN ELECTRONICS

BACKGROUND

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, they also generate more heat in a smaller space, making thermal management a greater concern than before.

The purpose of thermal management is to maintain the temperature of a device within a moderate range. During operation, electronic devices dissipate power as heat, which must be removed from the device. Otherwise, the electronic device will get hotter and hotter until it fails, reducing its service life. Short of failure, electronic devices run slowly and dissipate power poorly at high temperatures.

SUMMARY

Heat dissipation configurations and methods are described herein. In one or more embodiments, an apparatus for heat dissipation is provided. The apparatus includes an individual piece of metal having a thermally conductive metal surface. The metal surface includes a plurality of ridges or protrusions extending from a base of the metal surface, wherein an air flow channel is provided between each two adjacent protrusions, therein providing a plurality of air flow channels. The apparatus is configured to dissipate heat for an electronic device having an active cooling source directing air through the plurality of air flow channels.

In another embodiment, a vapor chamber is provided. The vapor chamber is configured to dissipate heat for an electronic device having an active cooling source (e.g., fan). The vapor chamber includes a first thermally conductive metal surface. The surface includes a section having a trough and a raised area or platform surrounded by the trough, wherein the raised area is configured to contact a microprocessor die in communication with the vapor chamber.

In another embodiment, a method is provided for making a heat dissipation apparatus. The method includes providing an individual piece of thermally conductive metal. The method further includes shaping the piece of metal to provide a plurality of ridges or protrusions on a first metal surface of the piece of metal, where the plurality of protrusions are configured to dissipate heat for the electronic device having an active cooling source through a plurality of air flow channels positioned between the plurality of protrusions.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DESCRIPTION OF THE DRAWING FIGURES

For a more complete understanding of the disclosure, reference is made to the following detailed description and accompanying drawing figures, in which like reference numerals may be used to identify like elements in the figures.

While the disclosed apparatuses, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein.

DETAILED DESCRIPTION

Disclosed herein are apparatuses, systems, and methods for dissipating heat from an electronic device. Such heat dissipation apparatuses, systems, or methods have several potential end-uses or applications, including any electronic device having an active or passive cooling component (e.g., fan). For example, the electronic device may be a laptop or tablet computer.

As used herein, "active cooling" may refer to the use of forced fluid movement (e.g. fans moving air or pumps moving water) to reduce the heat of a component (e.g., a microprocessor) of the electronic device. Active cooling contrasts with "passive cooling," which utilizes non-forced methods of cooling such as natural convection or radiation or involves reducing the speed at which a component (e.g., a microprocessor) is running to reduce the component's heat.

Improved heat dissipation within an electronic device may be implemented by one or more of the following: (1) providing or forming a first metal surface having a plurality of ridges or protrusions extending from the base of the first metal surface, where air flow channels are provided between the adjacent protrusions, (2) providing or forming a second metal surface, on an opposite side of the first metal surface, the second metal surface having a plurality of ridges or protrusions extending from the base of the second metal surface, and/or (3) providing or forming a section of the first or second metal surface having a trough and a raised area or platform surrounded by the trough, the raised area configured to contact a portion of a microprocessor die for improved heat dissipation.

Using one or more of these features described in greater detail below, improved heat dissipation may be provided for the electronic device. For example, the improved heat dissipation may be implemented for a vapor chamber, heat sink, heat fin, or heat pipe of the electronic device. With the improved heat dissipation feature, a more powerful microprocessor may be installed for an electronic device, a thinner electronic device may be designed, a higher processing speed may be provided, or a combination thereof when compared to a similar electronic device without one or more of the improved heat dissipation features. In other words, the heat dissipation features described herein may provide improved thermal management for an electronic device such as a tablet or laptop computer.

Heat Dissipation Features

Figure 1:
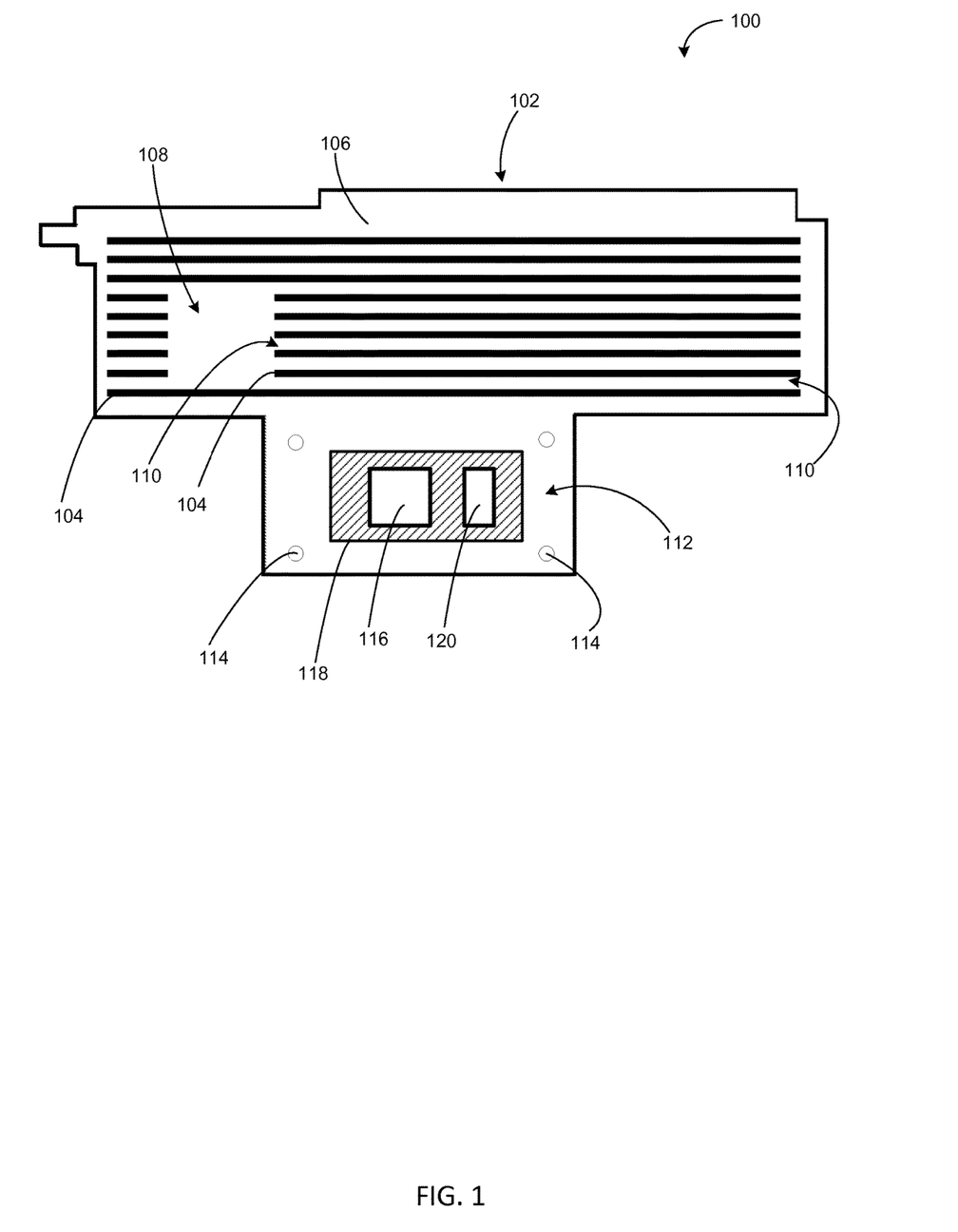
FIG. 1 depicts an example of a surface of a heat dissipation apparatus having a plurality of ridges and a section having a trough and a protrusion surrounded by the trough.

FIG. 1 depicts a non-limiting example of a heat dissipation apparatus 100 for an electronic device. The apparatus 100 includes an individual piece of metal comprising a thermally conductive metal surface 102. The individual piece of metal may be a metal having a high thermal conductivity (e.g., a thermal conductivity greater than 150 W/(m·K). For example, the metal may be an individual piece of copper, aluminum, gold, silver, or tungsten. In one particular example, the metal is copper.

In the non-limiting example depicted in FIG. 1, the heat dissipation apparatus 100 is a vapor chamber and the metal surface 102 represents one side of the vapor chamber. In other examples, the heat dissipation apparatus may be a heat sink, heat fin, or heat pipe. For heat fins, a plurality of heat dissipation apparatuses may be provided. For a heat pipe, the metal surface described herein may be molded or curved to provide an exterior surface of the pipe.

The metal surface 102 of the apparatus 100 includes a plurality of protrusions 104 extending from a base 106 of the metal surface. As depicted in FIG. 1, the protrusions 104 are elongated ridges extending from one end of the metal surface to the other end of the metal surface 102. Other protrusion shapes and positions are possible, some of which are discussed in greater detail below with reference to FIGS. 3 and 4.

The protrusions 104 may be absent in certain areas 108 of the metal surface 102 to avoid abutting or interfering with other conductive components housed within the electronic device. This may include conductive components affixed to and extending from a motherboard in the direction of the metal surface 102 of the heat dissipation apparatus 100.

A plurality of air flow channels 110 are provided between the protrusions 104. For example, one air flow channel is provided in a space between two adjacent protrusions 104. An additional air flow channel exists between two different, adjacent protrusions, and so on, therein providing the plurality of air flow channels 110 on the metal surface 102 of the heat dissipation apparatus 100.

The apparatus 100 may be combined with additional components of an electronic device, such as a microprocessor (e.g., central processing unit and/or graphics processing unit) and an active cooling source (e.g., a fan). The fan, when active, may drive air through the plurality of air flow channels 110 to assist in removing heat from the electronic device.

The protrusions 104 from the metal surface provide added surface area to the metal surface 102, as compared to a flat surface. The added surface area may allow for improved heat dissipation over an electronic device having a similarly dimensioned heat dissipation apparatus having a flat metal surface without protrusions.

In certain examples, the protrusions 104 may be formed by etching or carving out segments of metal from an individual piece of metal. In other examples, the protrusions 104 may be created by stamping or embossing the individual piece of metal. In certain examples, certain areas 108 on the metal surface may be designed with no protrusions so as to not interfere with electrically conductive neighboring components extending in the direction of the metal surface of the apparatus. In such an example, the area 108 is etched in its entirety or no embossing patterns are provided within the area 108.

As depicted in FIG. 1, the metal surface 102 of the heat dissipation apparatus 100 may include a section 112 separate from the plurality of protrusions. The section 112 may be configured to connect with a heat generating component to assist in heat dissipation. For example, the section 112 may be configured to connect with a microprocessor (e.g., a CPU or GPU) to assist in dissipating heat from the microprocessor. The microprocessor may be affixed to a substrate (such as a motherboard), which is connected to the section 112 of the heat dissipation apparatus 100 at a number of connection points 114 (e.g., screw holes in the heat dissipation apparatus 100).

Within the processing unit-connecting section 112 of the heat dissipation apparatus 100, the section 112 includes at least one raised area or platform 116 surrounded by a trough 118. The raised area 116 is configured to contact a heat generating component (e.g., microprocessor) of the electronic device. In certain examples, the raised area 116 is configured to contact a microprocessor die (e.g., a CPU die or GPU die). The trough 118 surrounding the raised area 116 provides an air flow channel around the contact area. This configuration in the section 112 of the metal surface 102 may allow for improved heat dissipation, by providing an area of contact between the thermally conductive metal and the heat source, while allowing for an air flow channel around the contact area. In other words, the combination of a raised area 116 contacting the microprocessor die and the trough 118 surrounding the contact area may provide improved heat dissipation over a flat piece of metal that either does not contact the microprocessor die or contacts the microprocessor die but does not include the air flow channel around the contact area.

In certain examples, as depicted in FIG. 1, a second raised area 120 may be provided and surrounded by the trough 118 within the section 112 of the heat dissipation apparatus 100. In other examples, additional raised areas may be configured within the trough 118 of the section 112 of the heat dissipation apparatus 100.

The second raised area 120 may be configured to contact an additional heat generating component in the electronic device. The additional heat generating component may be another processing unit die (e.g., another CPU or GPU) or a die of a platform controller hub (PCH). This may allow for contacting the microprocessor dies at their hottest locations.

In certain examples, the first raised area 116 and second raised area 120 may be configured to have different heights as measured from the surface of the trough 118. The differing heights may allow for improved contact with the first and second heat generating components, respectively. In such examples, the addition of a second, separate raised area 120 contacting a second heat generating component may provide further improved heat dissipation a single raised area contacting (or attempting to contact) both heat generating components.

In certain examples, the trough and the one or more raised areas may be formed by etching or carving out segments of metal from the metal surface 102. In some examples, the first and second raised areas may be etched to have different heights above the trough base to provide better contact with their respective heat generating source. Etching may provide a single piece of metal having high conductivity and low resistance when contacting the heat generating component, allowing for good heat dissipation in comparison with a configuration having higher resistance.

In alternative examples, a piece of thermally conductive metal (e.g., copper or aluminum) may be soldered onto a base (e.g., trough) within the section of the metal surface. The soldering process may provide a less expensive alternative to etching, but may increase the resistivity in the contact between the metal surface and heat generating component (which may lead to reduced heat dissipation).

The dimensions (e.g., length, width, perimeter, surface area) of the raised area or platform may be configurable as well based on the size of the heat generating component. For example, the length and width of the raised area may each be 0.1-2 mm larger than the corresponding length and width of the heat generating component (e.g., CPU die). This may allow for manufacturing tolerances when assembling the electronic device.

In certain examples, such as in the case of a vapor chamber, a second individual piece of metal having a metal surface may be provided to connect (either directly or indirectly) with the first piece of metal to form a sealed vacuum of the vapor chamber. In other examples, a second thermally conductive metal surface is provided from the same piece of metal as the first metal surface. For example, the piece of metal may be folded to provide two metal surfaces opposite each other and sealed along their edges to form the sealed vacuum of a vapor chamber between the two metal surfaces.

Figure 2:
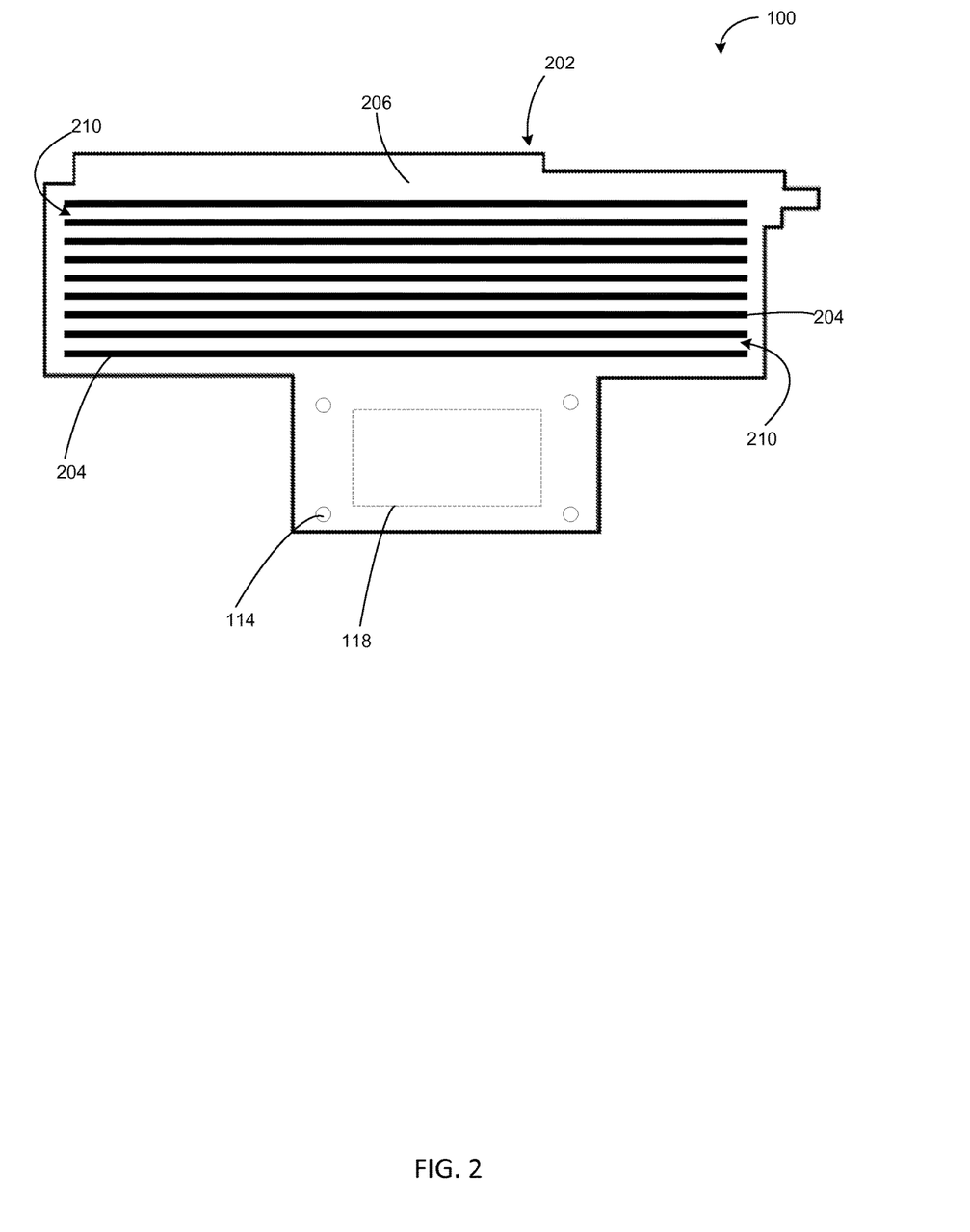
FIG. 2 depicts an additional example of a surface of a heat dissipation apparatus having a plurality of ridges or protrusions.

FIG. 2 depicts a second thermally conductive metal surface 202 for the heat dissipation apparatus 100 depicted in FIG. 1. As noted above, the second metal surface 202 may be provided from the same individual piece of metal as the first metal surface depicted in FIG. 1. In other examples, the second metal surface is a second individual piece of metal. In such examples, the individual piece of metal for the second surface may also be a metal having a high thermal conductivity (e.g., a thermal conductivity greater than 150 W/(m·K). For example, the second piece of metal may be an individual piece of copper, aluminum, gold, silver, or tungsten. In one particular example, the metal is copper. In certain examples, the first surface and the second surface are composed of the same metal (e.g., copper). In other examples, the first surface and the second surface are composed of different metals.

As depicted in FIG. 2, the second metal surface 202 of the apparatus 100 also includes a plurality of protrusions 204 extending from a base 206 of the metal surface 202. The protrusions 204 are elongated ridges extending from one end of the metal surface to the other end of the metal surface 202. Other protrusion shapes and positions are possible, some of which are discussed in greater detail below with reference to FIGS. 3 and 4. Similar or different protrusion patterns may be provided on the first and second surfaces to optimize heat dissipation from the electronic device.

A plurality of air flow channels 210 are provided between the protrusions 204. For example, one air flow channel is provided in a space between two adjacent protrusions 204. An additional air flow channel exists between two different, adjacent protrusions, and so on, therein providing the plurality of air flow channels 210 on the second metal surface 202 of the heat dissipation apparatus 100.

In certain examples, protrusions may be provided on both the first and second metal surfaces (e.g., as depicted in FIGS. 1 and 2). In other examples, a plurality of protrusions may be provided on only one of the first and second metal surfaces. In some examples, the plurality of protrusions are provided only on the first metal surface closest to the heat generating component (e.g., microprocessor). In other examples, the plurality of protrusions are provided only on the second metal surface furthest from the heat generating component (e.g., microprocessor).

Figure 3:
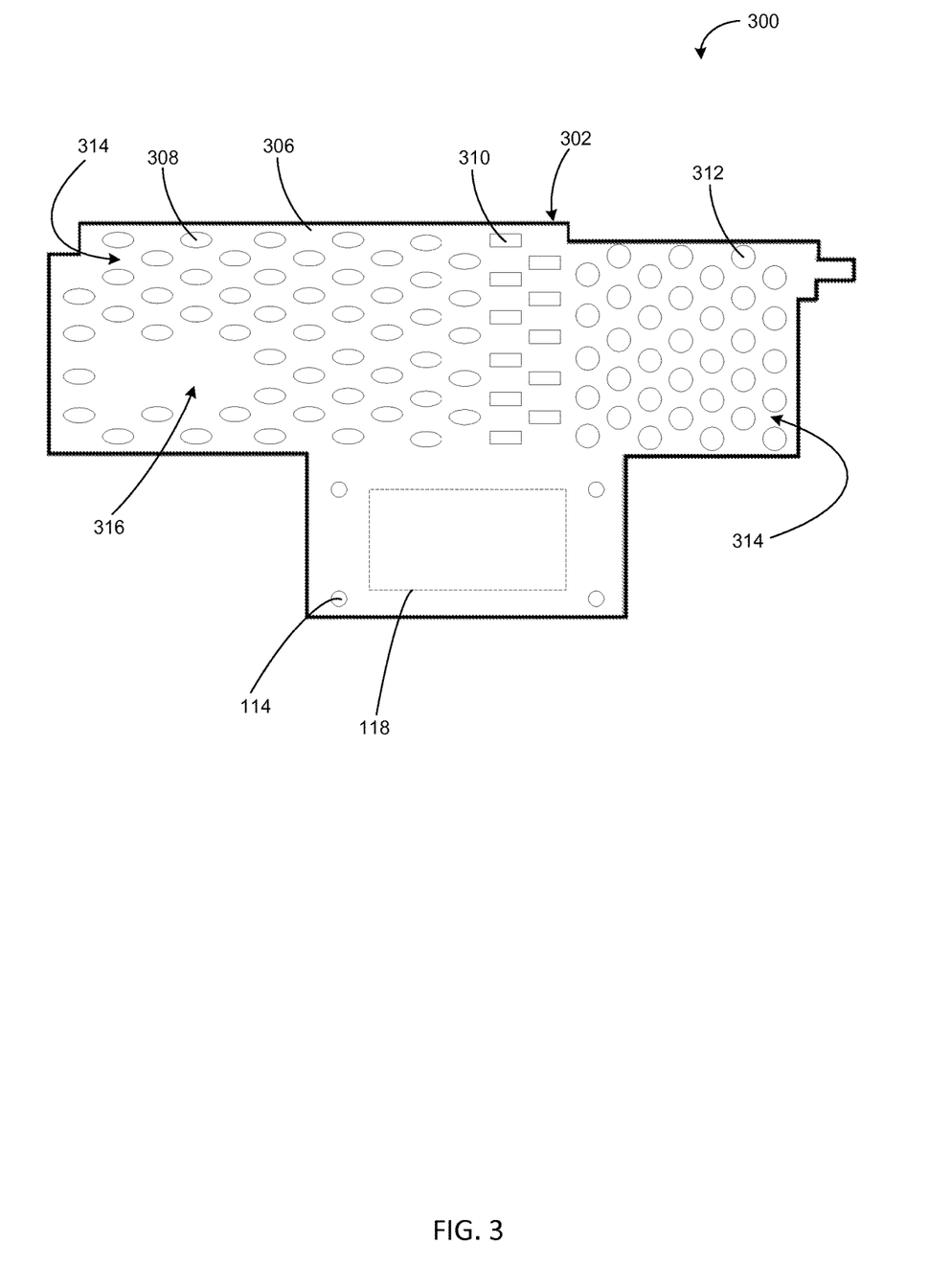
FIG. 3 depicts an additional example of a surface of a heat dissipation apparatus having a plurality of ridges or protrusions.

FIG. 3 depicts non-limiting examples of protrusion shapes on a metal surface 302 of a heat dissipation apparatus 300. In certain examples, the metal surface may include any number of different three-dimensional shapes, such as the elongated ridges depicted in FIGS. 1 and 2. The protrusion shapes, dimensions, and patterns on the metal surface may be configured to optimize heat dissipation based on the air flow and surface area characteristics of the metal surface. For example, an increase in surface area may cause a decrease in overall air flow speed over the metal surface. Therefore, optimization of heat dissipation involves providing a balance between increased surface area and air flow.

As depicted in FIG. 3, as viewed from a vantage point perpendicular to the metal surface 302, the three-dimensional protrusion shapes are depicted two-dimensionally. The protrusions extend from the base 306 of the metal surface. As depicted, the protrusion shapes may be ovular 308, rectangular 310, or circular 312. Neighboring columns of protrusion shapes may be offset from each other such that adjacent protrusion shapes are not located in the same rows as the neighboring column. Such an arrangement of protrusions creates tortuous air flow channels 314 that may assist in improved heat dissipation.

As noted with reference to FIG. 1, protrusions may be absent in certain areas 316 of the metal surface 302 to avoid abutting or interfering with other conductive components housed within the electronic device. This may include conductive components affixed and extending from a motherboard in the direction of the metal surface 302 of the heat dissipation apparatus 300.

Different or similar protrusion shapes and patterns may be present on one metal surface. Additionally, in some examples, different or similar shapes and patterns may be provided on the first and second metal surfaces of a heat dissipation apparatus (e.g., a vapor chamber).

Figure 4:
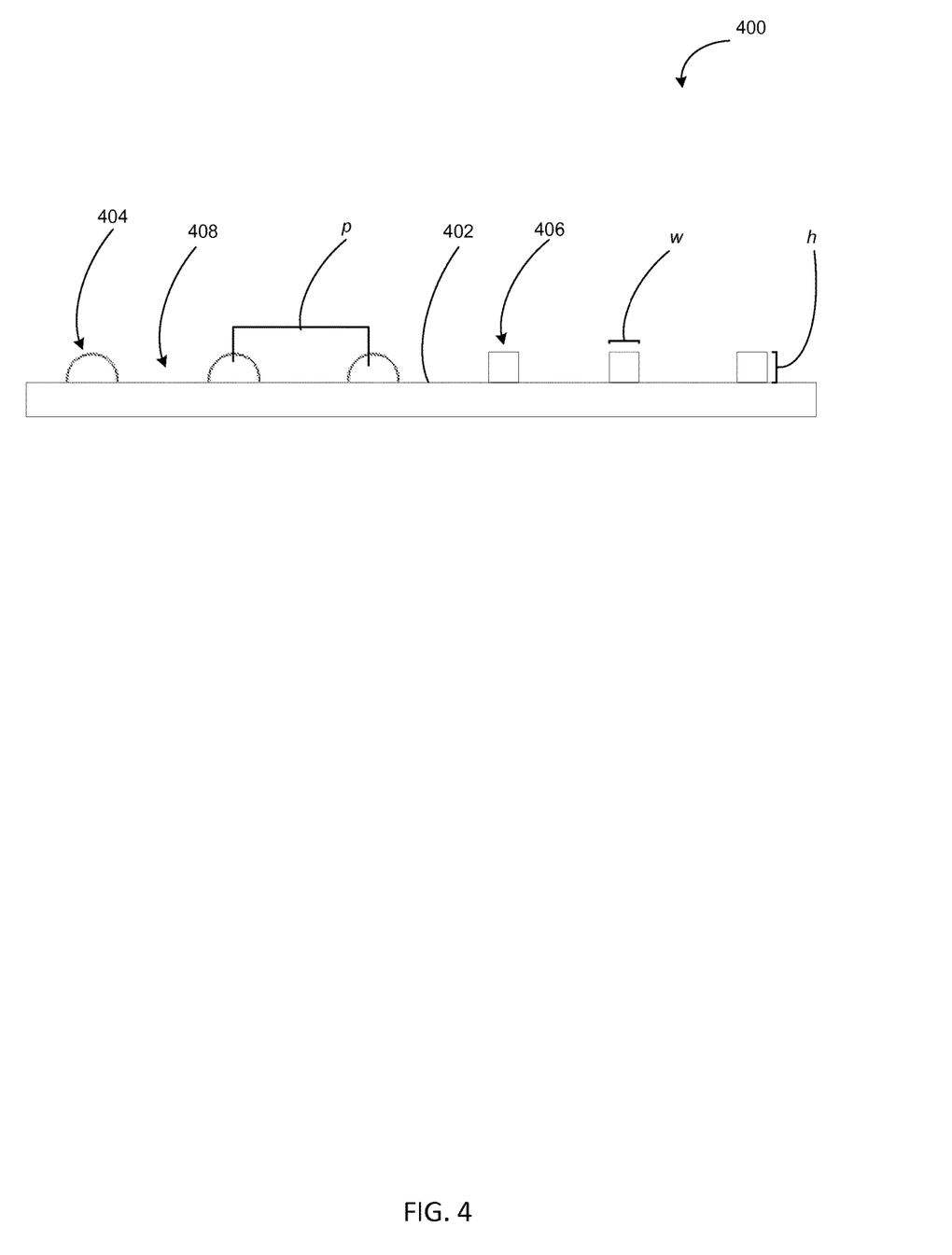
FIG. 4 depicts an example of a side-view of a surface of a heat dissipation apparatus having a plurality of ridges or protrusions.

FIG. 4 depicts non-limiting examples of dimensions of protrusion shapes on a metal surface 402 of a heat dissipation apparatus 400. As noted above with reference to FIG. 3, the protrusion shapes may be any number of different three-dimensional shapes. As depicted in FIG. 4, the metal surface 402 (as viewed from a side, along the plane of the metal surface) includes semicircular protrusions 404 and rectangular protrusions 406 extending from the base of the metal surface 402. An air flow channel 408 is provided between adjacent protrusions.

In certain examples, the height h of each protrusion is 0.01-1 mm, 0.01-0.5 mm, 0.02-0.2 mm, 0.05-0.15 mm, 0.05-0.1 mm, or 0.1 mm. In certain examples, the width w of each protrusion is 0.01-1 mm, 0.01-0.5 mm, 0.02-0.2 mm, 0.05-0.15 mm, 0.05-0.1 mm, or 0.1 mm. In certain examples, the distance or pitch p between adjacent protrusions (e.g., within a same row or within a same column) is 0.1-2 mm, 0.1-1 mm, 0.2-0.8 mm, 0.4-0.6 mm, or 0.5-0.55 mm.

The height h and width w of each protrusion and the pitch p between adjacent protrusions may be uniform for the metal surface. Alternatively, the height h and width w of each protrusion and the pitch p between adjacent protrusions on the metal surface may be variable. The variability may be based upon the neighboring components of the electrical device or may be based on an effort to achieve a certain heat dissipation characteristics for the electronic device.

Exemplary Method for Making Heat Dissipation Apparatus

Figure 5:
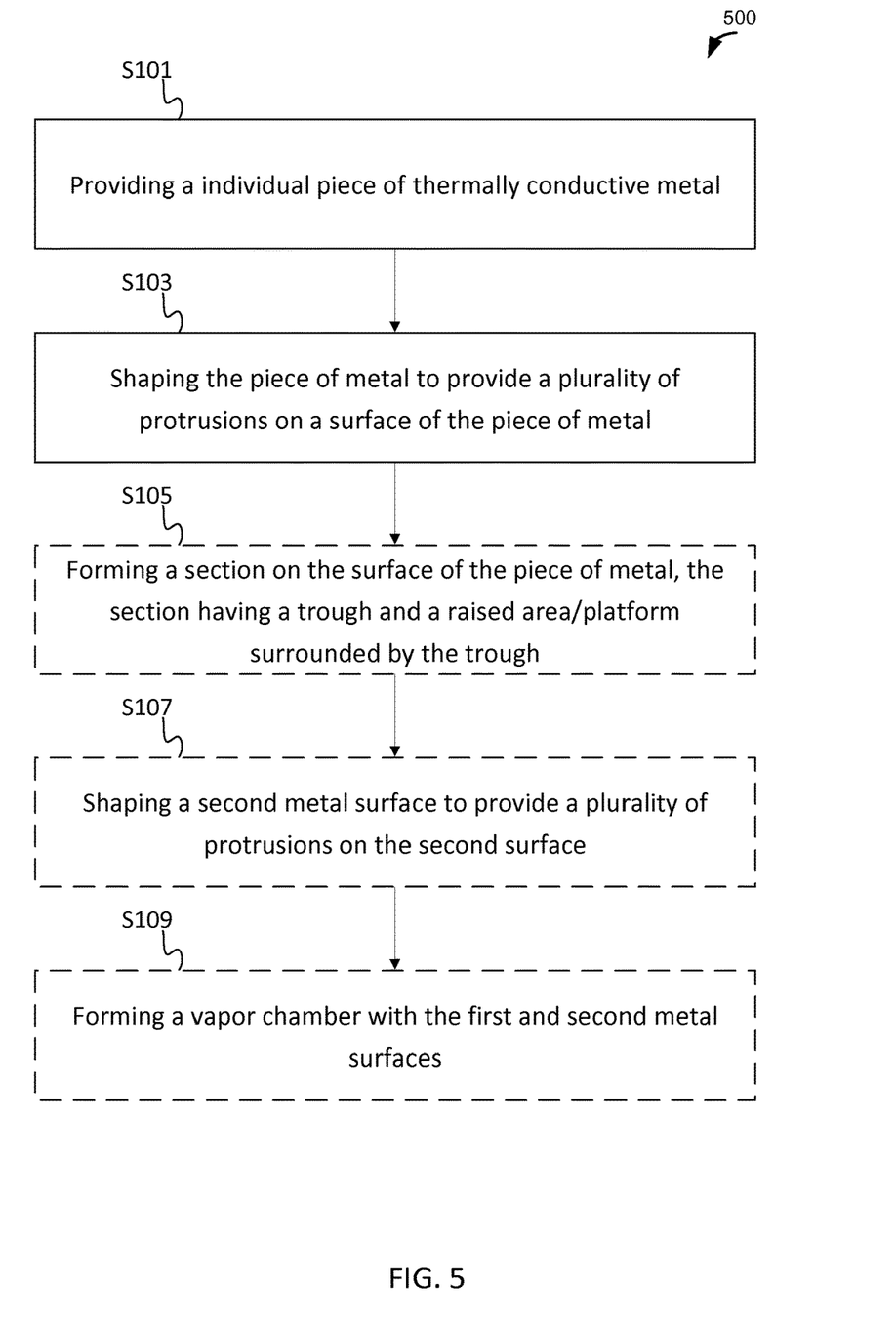
FIG. 5 is a flow diagram of a method of making a heat dissipation apparatus in accordance with one example.

FIG. 5 depicts an exemplary method 500 for making a heat dissipation apparatus. At act S101, an individual piece of thermally conductive metal is provided. In certain examples, such as in the case of etching the metal, the starting height or thickness of the piece of metal may be at least 0.01-1 mm, 0.01-0.5 mm, 0.02-0.2 mm, 0.05-0.15 mm, 0.05-0.1 mm, or 0.1 mm greater than the desired height or thickness for the heat dissipation apparatus. As noted above, the provided piece of metal may be a metal having a high thermal conductivity, (e.g., a thermal conductivity greater than 150 W/(m·K), such as copper.

At act S103, the piece of metal is shaped to provide a plurality of protrusions on a surface of the piece of metal. The protrusions may formed by etching or carving out segments of metal from an individual piece of metal, therein forming a plurality of air flow channels between the protrusions. The etching process may remove 0.01-1 mm, 0.01-0.5 mm, 0.02-0.2 mm, 0.05-0.15 mm, 0.05-0.1 mm, or 0.1 mm of metal in certain locations to form a base of the metal surface and protrusions extending from the base. In other examples, the protrusions may be created by stamping or embossing the individual piece of metal. As noted above, the etching or embossing process may be designed to create differing heights of protrusions in designated locations, or may have an absence of protrusions so as to not interfere with electrically conductive neighboring components extending in the direction of the metal surface of the apparatus.

In certain examples, the plurality of protrusions, and air flow channels in-between, may be covered with a thin layer of material to improve the emissivity of the metal. For example, the protrusions and air flow channels may be painted such as with a latex or alkyd-based paint. In one particular example, a black paint is applied to cover the protrusions and the air flow channels. The thinness of the layer of material (e.g., paint) may be 0.1-100 micrometers (microns), 1-50 microns, or 10-20 microns.

At optional act S105, a section on the surface of the piece of metal may be formed with a trough and one or more raised areas or platform surrounded by the trough. The trough and raised area may be shaped or formed through etching or embossing, like act S103. The trough and raised area may be in a section of the metal surface that is separate from the plurality of protrusions. As noted, there may be more than one raised area/platforms within the trough. The raised areas may be configurable in height, width, and length to touch one or more heat generating sources (e.g., microprocessor dies) present within the electronic device.

At optional act S107, an additional metal surface may be provided and shaped to provide a plurality of protrusions on the second metal surface. The additional metal surface may be provided by shaping (e.g., folding or bending) the individual piece of metal used for the first surface, wherein the first and second surfaces lie parallel with a plane and face in opposite directions. In other examples, the second metal surface may be provided or shaped from a second individual piece of metal. The protrusions on the second surface may be formed by etching or embossing like the first metal surface. The etching or extruding may create similar or different protrusion shapes and dimensions from the first metal surface.

At optional act S109, a vapor chamber may be formed by sealing the first and second metal surfaces directly with each other or indirectly through other pieces of metal. This act is not necessarily performed after the shaping of the protrusions. The formation of the vapor chamber may occur prior to any shaping (e.g., etching) on the first and/or second metal surfaces.

Exemplary Computing Environment

Figure 6:
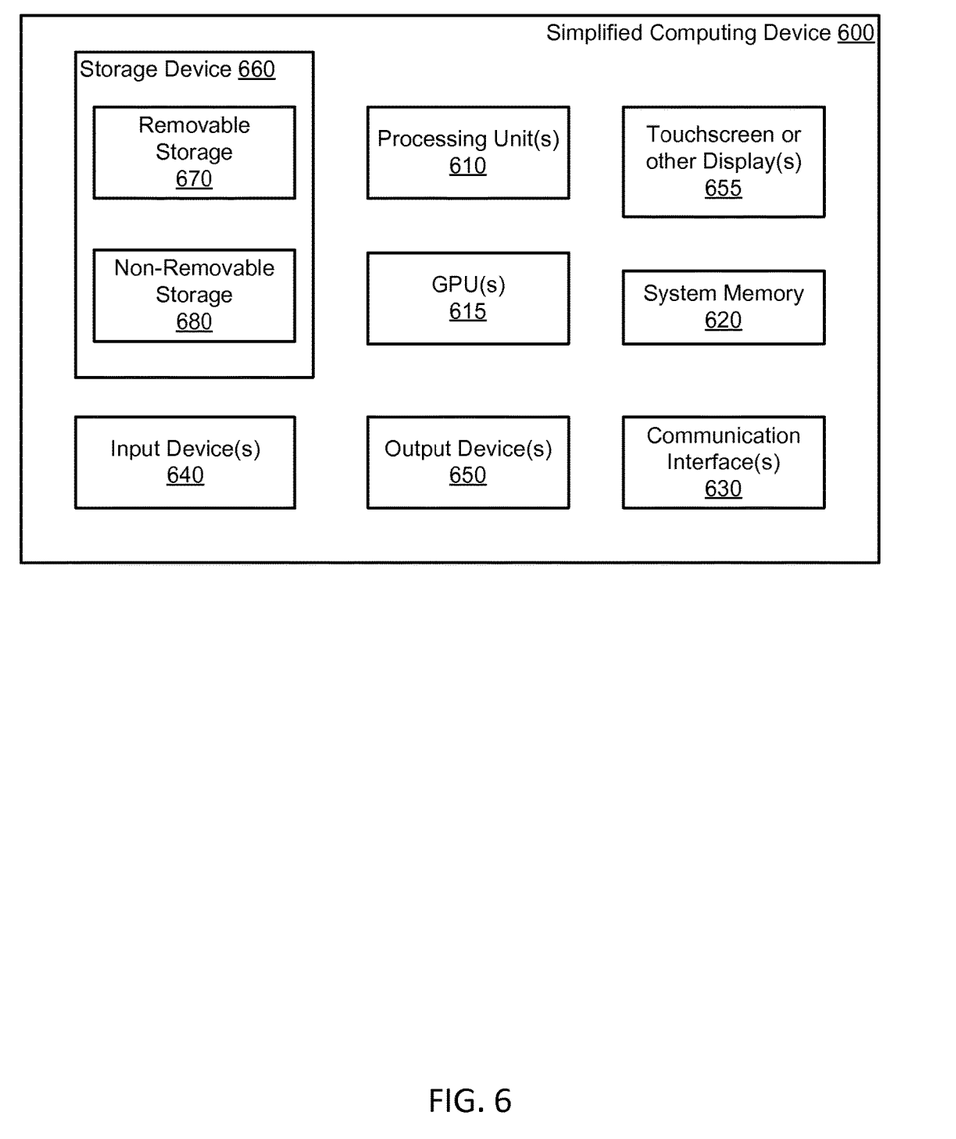
FIG. 6 is a block diagram of a computing environment in accordance with one example for implementation of the disclosed methods or one or more heat dissipation apparatuses.

With reference to FIG. 6, a heat dissipation apparatus as described above may be incorporated within an exemplary computing environment 600. The computing environment 600 may correspond with one of a wide variety of computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. In particular, the heat dissipating apparatus is incorporated within a computing environment having an active cooling source (e.g., fan).

The computing environment 600 has sufficient computational capability and system memory to enable basic computational operations. In this example, the computing environment 600 includes one or more processing unit(s) 610, which may be individually or collectively referred to herein as a processor. The computing environment 600 may also include one or more graphics processing units (GPUs) 615. The processor 610 and/or the GPU 615 may include integrated memory and/or be in communication with system memory 620. The processor 610 and/or the GPU 615 may be a specialized microprocessor, such as a digital signal processor (DSP), a very long instruction word (VLIW) processor, or other microcontroller, or may be a general purpose central processing unit (CPU) having one or more processing cores. The processor 610, the GPU 615, the system memory 620, and/or any other components of the computing environment 600 may be packaged or otherwise integrated as a system on a chip (SoC), application-specific integrated circuit (ASIC), or other integrated circuit or system.

The computing environment 600 may also include other components, such as, for example, a communications interface 630. One or more computer input devices 640 (e.g., pointing devices, keyboards, audio input devices, video input devices, haptic input devices, or devices for receiving wired or wireless data transmissions) may be provided. The input devices 640 may include one or more touch-sensitive surfaces, such as track pads. Various output devices 650, including touchscreen or touch-sensitive display(s) 655, may also be provided. The output devices 650 may include a variety of different audio output devices, video output devices, and/or devices for transmitting wired or wireless data transmissions.

The computing environment 600 may also include a variety of computer readable media for storage of information such as computer-readable or computer-executable instructions, data structures, program modules, or other data. Computer readable media may be any available media accessible via storage devices 660 and includes both volatile and nonvolatile media, whether in removable storage 670 and/or non-removable storage 680. Computer readable media may include computer storage media and communication media. Computer storage media may include both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may accessed by the processing units of the computing environment 600.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

Claim Support Section

In a first embodiment, an apparatus comprises an individual piece of metal comprising a thermally conductive metal surface, the metal surface having a plurality of protrusions extending from a base of the metal surface, wherein an air flow channel is provided between each two adjacent protrusions, therein providing a plurality of air flow channels, wherein the apparatus is configured to dissipate heat for an electronic device having an active cooling source directing air through the plurality of air flow channels.

In a second embodiment, with reference to the first embodiment, the metal is copper.

In a third embodiment, with reference to the first embodiment or the second embodiment, the apparatus is a heat pipe, heat sink, or heat fin.

In a fourth embodiment, with reference to any of embodiments 1-3, the metal surface is a first metal surface of a vapor chamber.

In a fifth embodiment, with reference to the fourth embodiment, the apparatus further comprises a second thermally conductive metal surface of the vapor chamber, the second metal surface opposite the first metal surface such that a sealed vacuum of the vapor chamber is positioned between the first metal surface and the second metal surface, wherein the second metal surface comprises a plurality of protrusions configured to dissipate heat for the electronic device through a plurality of air flow channels positioned between the plurality of protrusions of the second metal surface.

In a sixth embodiment, with reference to the fifth embodiment, the first metal surface of the vapor chamber further comprises an section separate from and adjacent to the plurality of protrusions, the section of the first metal surface having a trough and a raised area surrounded by the trough, wherein the raised area is configured to contact a microprocessor die in communication with the vapor chamber.

In a seventh embodiment, with reference to any of embodiments 1-6, each protrusion of the plurality of protrusions comprises a width of 0.01-0.2 mm, a height of 0.01-0.2 mm, and a pitch to an adjacent protrusion of at least 0.1 mm.

In an eighth embodiment, with reference to any of embodiments 1-7, each protrusion of the plurality of protrusion is ovular, circular, rectangular, or a square, as viewed two-dimensionally from a point of view perpendicular to the metal surface.

In a ninth embodiment, a vapor chamber comprises a first thermally conductive metal surface comprising a section having a trough and a raised area surrounded by the trough, wherein the raised area is configured to contact a microprocessor die in communication with the vapor chamber, and wherein the vapor chamber is configured to dissipate heat for an electronic device having an active cooling source.

In a tenth embodiment, with reference to the ninth embodiment, the section of the first metal surface further comprises a second raised area surrounded by the trough, the second raised area configured to contact an additional component in communication with the vapor chamber.

In an eleventh embodiment, with reference to the tenth embodiment, the raised area and the second raised area have different heights.

In a twelfth embodiment, with reference to any of embodiments 9-11, the raised area and/or the second raised area is soldered to the trough.

In a thirteenth embodiment, with reference to any of embodiments 9-12, a second thermally conductive metal surface of the vapor chamber opposite the first metal surface such that a sealed vacuum of the vapor chamber is positioned between the first metal surface and the second metal surface, wherein the second metal surface comprises a plurality of protrusions configured to dissipate heat for the electronic device through a plurality of air flow channels positioned between the plurality of protrusions of the second metal surface.

In a fourteenth embodiment, a method of making a heat dissipating apparatus for an electronic device comprises providing an individual piece of thermally conductive metal, and shaping the piece of metal to provide a plurality of protrusions on a first metal surface of the piece of metal, the plurality of protrusions configured to dissipate heat for the electronic device having an active cooling source through a plurality of air flow channels positioned between the plurality of protrusions.

In a fifteenth embodiment, with reference to the fourteenth embodiment, the plurality of protrusions of the first metal surface are provided by etching.

In a sixteenth embodiment, with reference to the fourteenth embodiment or the fifteenth embodiment, the plurality of protrusions of the first metal surface are provided by embossing.

In a seventeenth embodiment, with reference to any of embodiments 14-16, the method further comprises forming a vapor chamber having a sealed vacuum by joining the first metal surface of the piece of metal with a second metal surface, the sealed vacuum positioned between the first metal surface and the second metal surface.

In an eighteenth embodiment, with reference to the seventeenth embodiment, the method further comprises shaping the second metal surface to provide a plurality of protrusions on the second metal surface, the plurality of protrusions configured to dissipate heat for the electronic device having an active cooling source through a plurality of air flow channels positioned between the plurality of protrusions.

In a nineteenth embodiment, with reference to any of embodiments 14-18, the method further comprises forming a section on the first metal surface of the separate from the plurality of protrusions, the section of the first metal surface having a trough and a raised area surrounded by the trough, wherein the raised area is configured to contact a microprocessor die in communication with the vapor chamber.

In a twentieth embodiment, with reference to the nineteenth embodiment, the trough and raised area are formed by etching the section of the first metal surface.

What is claimed is:

1. An electronic device comprising:
a heat generating component;
an apparatus having an individual piece of metal comprising a thermally conductive metal surface, the thermally conductive metal surface having a first section comprising a plurality of protrusions extending from a base of the thermally conductive metal surface and a second section separate from and adjacent to the first section, wherein the second section of the thermally conductive metal surface comprises a raised area and a trough surrounding a perimeter of the raised area; and an active cooling source, wherein an air flow channel is provided between each two adjacent protrusions of the plurality of protrusions, therein providing a plurality of air flow channels, wherein the raised area contacts the heat generating component, wherein the trough comprises a trough air flow channel around the perimeter of the raised area, and wherein the electronic device dissipates heat from the heat generating component by driving air from the active cooling source through the trough air flow channel and the plurality of air flow channels.

2. The electronic device of claim 1, wherein the individual piece of metal is copper.

3. The electronic device of claim 1, wherein the apparatus is a heat pipe, heat sink, or heat fin.

4. The electronic device of claim 1, wherein the thermally conductive metal surface is a first thermally conductive metal surface of a vapor chamber.

5. The electronic device of claim 4, further comprising:
a second thermally conductive metal surface of the vapor chamber, the second metal surface opposite the first thermally conductive metal surface such that a sealed vacuum of the vapor chamber is positioned between the first thermally conductive metal surface and the second thermally conductive metal surface, wherein the second thermally conductive metal surface comprises a plurality of protrusions, and wherein the electronic device dissipates heat from the heat generating component by driving air from the active cooling source through a plurality of air flow channels positioned between the plurality of protrusions of the second thermally conductive metal surface.

6. The electronic device of claim 1, wherein each protrusion of the plurality of protrusions comprises a width of 0.01-0.2 mm, a height of 0.01-0.2 mm, and a pitch to an adjacent protrusion of the plurality of protrusions of at least 0.1 mm.

7. The electronic device of claim 1, wherein each protrusion of the plurality of protrusions is ovular, circular, rectangular, or a square, as viewed two-dimensionally from a point of view perpendicular to the thermally conductive metal surface.

8. The electronic device of claim 1, wherein the second section comprises an additional raised area surrounded by the trough,
wherein the additional raised area is configured to contact the heat generating component or a separate heat generating component of the electronic device, and
wherein a height of the additional raised area is different from a height of the raised area.

9. The electronic device of claim 1, wherein the heat generating component is a microprocessor die.

10. The electronic device of claim 1, wherein the active cooling source is a fan.

* * * * *